United States Patent
Iwai et al.

(10) Patent No.: US 6,320,319 B1
(45) Date of Patent: Nov. 20, 2001

(54) CHARGED PARTICLE GENERATING APPARATUS

(75) Inventors: Toshimichi Iwai; Takayuki Nakamura; Akira Kintaka, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/461,219

(22) Filed: Dec. 16, 1999

(30) Foreign Application Priority Data

Dec. 16, 1998 (JP) .................................................. 10-357755

(51) Int. Cl.[7] .................................................... H05B 41/36
(52) U.S. Cl. ............................................. 315/106; 315/107
(58) Field of Search .................................... 315/106, 107, 315/105, 94

(56) References Cited

U.S. PATENT DOCUMENTS 4,059,783  11/1977  Nakaizumi et al. .
4,642,518  2/1987  Dard .

FOREIGN PATENT DOCUMENTS 1277098  6/1972  (GB) .
1380126  1/1975  (GB) .
1535747  12/1978  (GB) .
59-169044  9/1984  (JP) .

Primary Examiner—David Vu
(74) Attorney, Agent, or Firm—Rosenthal & Osha L.L.P.

(57) ABSTRACT

A charged particle generating apparatus including a first electrode, a second electrode, a current source supplying a current to the first electrode for heating the first electrode and a voltage source for generating an attraction voltage for generation of an electric field between the first electrode and the second electrode. The first electrode discharges charged particles as a result of the generation of the electric field between the first electrode and the second electrode. The apparatus further includes a heat current measurement unit for measuring the current for heating the first electrode, an electrode current measurement unit for measuring electrode current flowing through the second electrode in accordance with an amount of the charged particles discharged from the first electrode to the second electrode, and a power supply shut-down circuit for terminating at least one of the supply of the current for heating the first electrode and the generation of the attraction voltage based on the current measured by the heat current measurement unit or the electrode current measured by the electrode current measurement unit.

17 Claims, 9 Drawing Sheets

CHARGED PARTICLE GENERATING APPARATUS

This patent application claims priority based on Japanese patent application, H10-357755 filed on Dec. 16, 1998, the contents of which are incorporated herein by reference.

BACKGROUND OF THE INVENTION

1. Field of the Invention

The present invention relates to a charged particle generating apparatus for generating charged particles, and more particularly to a charged particle generating apparatus capable of preventing damage, which may be caused by incomplete contact between the cable connecting the electrode and the generating apparatus, to an electrode discharging charged particles.

2. Description of the Related Art

FIG. 1 shows a block diagram of a conventional charged particle generating apparatus. The charged particle generating apparatus 10 includes a first electrode 12, a second electrode 14, a current source 16, a first voltage source 18, a third electrode 20, a second voltage source 22 and a third voltage source 24. The charged particle generating apparatus 10 further includes a connection cable J1 and a connection cable J2. The connection cable J1 shown in FIG. 1 makes an electrical connection between the second electrode 14 and the voltage source 18. The connection cable J2 makes an electrical connection between the first electrode 12 and the current source 16. The charged particle generating apparatus 10 is an electron gun generating an electron beam 30.

The current source 16 supplies current to the first electrode 12 in order to heat the first electrode 12 to a predetermined temperature. The voltage source 18 then applies voltage to the second electrode 14 to generate an electric field between the first electrode 12 and the second electrode 14. The electric field is generated in such a way that the charged particles are attracted toward the second electrode 14. Thus, the electron beam 30 is discharged from the first electrode 12 to the second electrode 14 because of the attraction formed by the electric field generated by the second electrode 14. The second voltage source 22 applies negative voltage to the third electrode 20. The result of this is that the third electrode 20 electrically attracts the electron beam 30 toward the second electrode 14. The third voltage source 24 maintains the particle generating apparatus 10 with a negative potential to earth so that the electron beam 30 is easily discharged.

FIG. 2 (a) shows a current/time chart showing the ideal controlled current to be applied to the first electrode 12 for heating the first electrode 12 by the current source 16. If the maximum current Ih is applied to the first electrode 12 in one step, a large amount of current flows through the first electrode 12 instantaneously. This causes unequal heat distribution on the first electrode 12 and increases the tension in a part of the first electrode 12. The maximum current Ih is generally 2 to 3 amperes. The tension increase in the part of the first electrode 12 is undesirable because it may damage the first electrode 12. Therefore, the current is gradually applied to the first electrode 12 up to the maximum current Ih as shown in FIG. 2 (a). The time "t1" is on average from approximately ten seconds to one hundred seconds.

FIG. 2(b) shows a voltage/time chart showing the ideal controlled voltage to be applied to the second electrode 14 by the voltage source 18. If the maximum voltage Vmax is applied to the second electrode 14 in one step, the first electrode 12 may be damaged. The maximum voltage Vmax is generally about 5 kV to 7 kV. When the maximum voltage Vmax is applied to the second electrode 14, instantaneously a large amount of current may flow through the first electrode 12. This increases the tension in a part of the first electrode 12. Therefore, the voltage is gradually applied to the second electrode 14 up to the maximum voltage Vmax as shown in FIG. 2(b). The period between t1 and t2 is on average from approximately ten seconds to one hundred seconds.

The current/time characteristics and the voltage/time characteristics respectively shown in FIGS. 2(a) and 2(b) are predetermined by software included in the charged particle generating apparatus 10. Therefore, the conventional charged particle generating apparatus 10 cannot respond to an accident happening to any of the components included in the apparatus 10, for example, the current/time characteristic and the voltage/time characteristic when the connection cables J1 and J2 do not work normally.

FIG. 3(a) shows a current/time chart showing current applied at time t3 to the first electrode 12 by the current source 16 when the electric connection between these (the connection cable J2) is accidentally disconnected. The electric connection is then reformed at time t4. When the electric connection between the first electrode 12 and the current source 16 is disconnected at time t3, the current does not flow through the first electrode 12 thereby cooling it. When the electric connection between the first electrode 12 and the current source 16 is reformed at time t4, the maximum current Ih as shown in FIG. 2(a) is applied to the first electrode 12 instantaneously. As described above, if the maximum current is applied to the first electrode 12 in one step, the first electrode 12 may be damaged.

FIG. 3(b) shows a voltage/time chart showing voltage to be applied to the second electrode 14 by the voltage source 18 when the electric connection between these (the connection cable ii) is accidentally disconnected at time t5. The electric connection is then reformed at time t6. When the electric connection between the second electrode 14 and the voltage source 18 is disconnected at time t5, voltage is not supplied to the second electrode 14. When the electric connection between the second electrode 14 and the voltage source 18 is reformed at time t6, the maximum voltage Vmax as shown in FIG. 2(b) is instantaneously applied to the second electrode 14. As described above, if the maximum voltage is applied to the second electrode 14 in one step, a large amount of current may flow through the first electrode 12 and cause damage to the first electrode 12.

SUMMARY OF THE INVENTION

Therefore, it is an object of the present invention to provide a charged particle generating apparatus that overcomes the above issues in the related art. This object is achieved by combinations described in the independent claims. The dependent claims define further advantageous and exemplary combinations of the present invention.

In order to solve the above-stated problem, the present invention provides a charged particle generating apparatus comprising: a first electrode for discharging charged particles; a second electrode for generating an electric field to attract the charged particles from the first electrode; a voltage source for generating an attraction voltage to generate the electric field between the first electrode and the second electrode; an electrode current measurement unit for measuring electrode current flowing through the second electrode in accordance with an amount of the charged particles discharged from the first electrode to the second electrode; and a power supply shut-down circuit for shutting down power supply to the voltage source to terminate the generation of the attraction voltage based on the electrode current measured by the electrode current measurement unit.

The power supply shut-down circuit may comprise a comparator for comparing the electrode current measured by the electrode current measurement unit with a predetermined value, the power supply shut-down circuit shutting down power supply to the voltage source to terminate the generation of the attraction voltage when the comparator detects the measured electrode current is less than the predetermined value.

In order to solve the above-stated problem, the present invention further provides a charged particle generating apparatus comprising: a first electrode for discharging charged particles; a current source supplying a current to the first electrode for heating the first electrode; a heat current measurement unit for measuring the current for heating the first electrode; a second electrode for generating an electric field to attract the charged particles from the first electrode; a voltage source for generating an attraction voltage for generation of an electric field between the first electrode and the second electrode; an electrode current measurement unit for measuring electrode current flowing through the second electrode in accordance with an amount of the charged particles discharged from the first electrode to the second electrode; and a power supply shut-down circuit for shutting down power supply to at least one of the current source and the voltage source, based on at least one of the current measured by the heat current measurement unit and the electrode current measured by the electrode current measurement unit.

The power supply shut-down circuit may terminate the generation of the attraction voltage based on the electrode current measured by the electrode current measurement unit.

The power supply shut-down circuit may terminate the supply of the current for heating the first electrode based on the electrode current measured by the electrode current measurement unit.

The power supply shut-down circuit may comprise a first comparator for comparing the electrode current measured by the electrode current measurement unit with a predetermined value, the power supply shut-down circuit terminating the supply of the current for heating the first electrode and the generation of the attraction voltage when the first comparator detects the measured electrode current is less than the predetermined value.

The power supply shut-down circuit may terminate the supply of the current for heating the first electrode based on the current measured by the heat current measurement unit.

The power supply shutdown circuit may terminate the generation of the attraction voltage based on the current measured by the heat current measurement unit.

The power supply shut-down circuit may comprise a second comparator for comparing the current measured by the heat current measurement unit with a predetermined value, the predetermined value being a controlled value of a current to be supplied from the current source to the first electrode, and the power supply shut-down circuit terminating the supply of the current for heating the first electrode and the generation of the attraction voltage when the second comparator detects the measured current is less than the predetermined value.

In order to solve the above-stated problem, the present invention further provides an apparatus for irradiating charged particles on a sample to measure a condition of the sample by detecting reflection of secondary electrons radiated from the sample after the charged particles are irradiated on the sample. The apparatus comprises a charged particle generating apparatus for irradiating the charged particles on the sample; a focussing unit for focussing the charged particle irradiated from the charged particle generating apparatus onto the sample; a signal generator for receiving the secondary electrons radiated from the sample and outputting a secondary electron detecting signal corresponding to an amount of the secondary electrons; and a measurement unit for measuring the condition of the sample based on the secondary electron detecting signal. The charged particle generating apparatus comprises: a first electrode for discharging charged particles; a current source supplying a current to the first electrode for heating the first electrode; a heat current measurement unit for measuring the current for heating the first electrode; a second electrode for generating an electric field to attract the charged particles from the first electrode; a voltage source for generating an attraction voltage for generation of the electric field between the first electrode and the second electrode; an electrode current measurement unit for measuring electrode current flowing through the second electrode in accordance with an amount of the charged particles discharged from the first electrode to the second electrode; and a power supply shut-down circuit for terminating at least one of at least one of the supply of the current for heating the first electrode and the generation of the attraction voltage based on the current measured by the heat current measurement unit, or the electrode current measured by the electrode current measurement unit.

This summary of the invention does not necessarily describe all essential features. The invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 4:
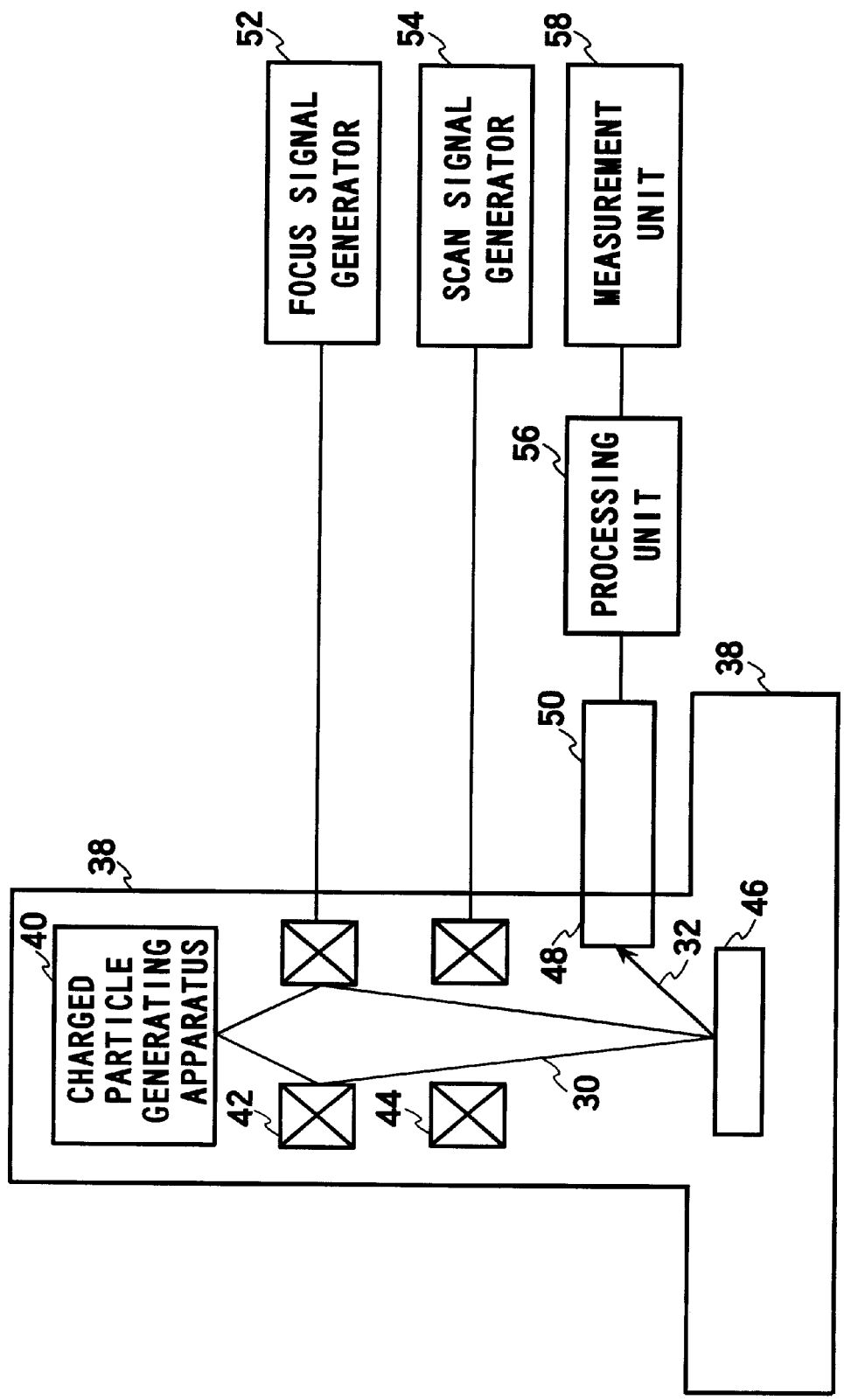
FIG. 4 shows a structure of an electron beam tester.

FIG. 4 shows a structure of an electron beam tester, which will be referred to as "EB tester" hereinafter. The EB tester includes an irradiating unit 38 for irradiating charged particles. The irradiating unit 38 includes a charged particle generating apparatus 40, an objective glass coil 42, a scan coil 44 and a scintillator 48. A sample 46 is set in the irradiating unit 38. The EB tester further includes a photomultiplier counter 50, a first signal generator 52, a second signal generator 54, a processing unit 56 and a measurement unit 58. The first signal generator 52 generates and outputs to the objective glass coil 42 a focus signal for focusing an electron beam 30. The second signal generator 54 generates and outputs to the scan coil 44 a scan signal for scanning the electron beam 30 on the sample 46.

In the irradiating unit 38, the charged particle generating apparatus 40 irradiates the electron beam 30 on the sample 46. The electron beam 30 is focussed by the objective glass coil 42 in order to allow irradiation of a specific part of the sample 46. If a user desires a SEM (scanning electron microscope) image of the sample surface, the electron beam 30 is scanned across the sample in accordance with a magnetic field generated at the scan coil 44. When the electron beam 30 is irradiated on the sample, secondary electrons 32 are radiated from the sample and input to the scintillator 48.

When the secondary electrons 32 are input to the scintillator 48, flashing light is generated. The flashing light then reacts with a photoelectric surface of a photomultiplier counter 50 to discharge photoelectrons. The scintillator 48 and the photomultiplier counter 50 form together with other optional circuits(not shown in the drawings) a generator for generating a secondary electron detecting signal corresponding to the amount of secondary electrons. In this example, the scintillation detector serves as the generator of the secondary electron detecting signal. The scintillation detector counts the number of photoelectrons flowing through the photomultiplier counter 50, and outputs the secondary electron detecting signal based on this. The signal is input to a processing unit 56 in order to have the necessary processes carried out and then output to a measurement unit 58. The measurement unit 58 measures a condition of the sample 46 based on the input secondary electron detecting signal. When the sample 46 is a semiconductor device, the charged particle generating apparatus 40 irradiates the electron beam 30 to a specific wiring. The measurement unit 58 measures whether or not the specific wiring of the sample 46 is normal based on the secondary electron detecting signal produced by the generator.

Figure 5:
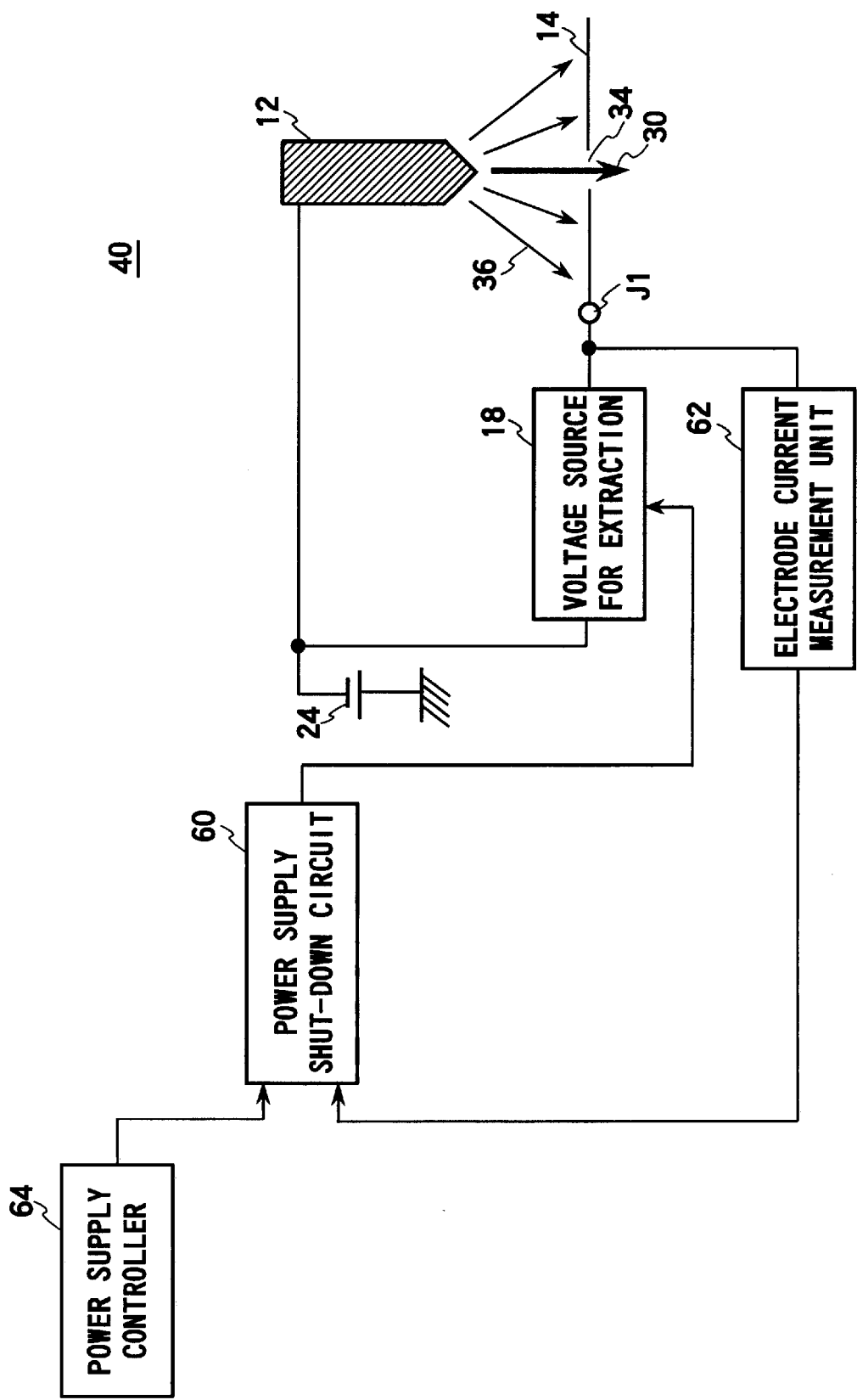
FIG. 5 shows a block diagram of the first embodiment of the charged particle generating apparatus 40 according to the present invention.

FIG. 5 shows a block diagram of the first embodiment of a charged particle generating apparatus according to the present invention. The charged particle generating apparatus 40 comprises a first electrode 12, a second electrode 14, a voltage source 18, a third voltage source 24, a power supply shut-down circuit 60, an electrode current measurement unit 62, and a power supply controller 64. The second electrode 14 and the voltage source 18 are connected electrically via a connection cable J1. The charged particle generating apparatus 40 of this first embodiment is an electron gun generating an electron beam 30, and the first electrode 12 is a field-emission cathode.

The voltage source 18 applies voltage to the second electrode 14 such that the second electrode generates an electric field between the first electrode 12 and the second electrode 14. When a field-emission cathode is used as the first electrode 12, the electric field between the first electrode 12 and the second electrode 14 may be, for example, approximately $5 \times 10^3$ v/cm. When the charged particle generating apparatus 40 is an electron gun, the third voltage source 24 applies negative potential to the entire charged particle generating apparatus 40 so that the electron beam 30 is easily irradiated from it. When, on the other hand, the charged particle generating apparatus 40 is an ion gun, the third voltage source 24 applies positive potential to the whole charged particle generating apparatus 40 so that the charged particles are easily irradiated from it.

As a result of the electric field generated by the second electrode 14, the electron beam 30, which is charged particles, is discharged from the first electrode 12. The electron beam 30 is irradiated to a sample, which is shown as 46 in FIG. 4, through a slot 34 formed at the second electrode 14. However, some of the particles 36 do not pass through the slot 34 of the second electrode 14 and irradiate the second electrode 14 itself. An electrode current flows through the second electrode 14 because of these particles irradiating it. This electrode current is related to and almost proportional to the amount of charged particles discharged to the second electrode 14.

The value of the electrode current is measured using the electrode current measurement unit 62, and the measured value is transferred to the power supply shut-down circuit 60. The power supply shut-down circuit 60 is capable of terminating the voltage supply from the voltage source 18.

How the power supply shut-down circuit 60 terminates the voltage supply from the voltage source 18 will be described in the following. The power supply shut-down circuit 60 firstly compares the electrode current measured by the electrode current measurement unit 62 with a predetermined value. When the power supply shut-down circuit 60 detects that the measured electrode current is greater than a predetermined value, the power supply shut-down circuit 60 controls the voltage source 18 to continue the voltage supply. When, on the other hand, the power supply shut-down circuit 60 detects that the measured electrode current is less than a predetermined value, the power supply shut-down circuit 60 controls the voltage source 18 to terminate the voltage supply.

If the connection cable J1 is broken or has incomplete contact with the second electrode 14, the electrode current measurement unit 62 cannot detect the electrode current or detects only a part of the electrode current. Therefore, when the power supply shut-down circuit 60 detects that the measured electrode current is less than a predetermined value, even though the electron beam 30 is generated normally, it is obvious that an accident has happened to the connection cable J1. Thus, the power supply shut-down circuit 60 controls the voltage source 18 and terminates the voltage supply.

Another means by which the power supply shut-down circuit 60 terminates the voltage supply from the voltage source 18 will be described in the following. In this method, the power supply controller 64 transfers a predetermined current value to the power supply shut-down circuit 60. The predetermined current value is a controlled value of current, flowing through the second electrode 14 because of the electric field generated by supplying voltage from the voltage source 18 to the second electrode 14. Then, the power supply shut-down circuit 60 compares the measured value of the electrode current and the controlled-current value transferred from the power supply controller 64. When the charged particle generating apparatus 40 is operated normally, the measured value of the current is equal to the controlled value of the electrode.

However, when the connection cable J1 is broken or has incomplete contact with the second electrode 14, the electrode current measurement unit 62 cannot detect the electrode current or detects only a part of the electrode current. Therefore, when the power supply shut-down circuit 60 detects that the measured electrode current is less than a predetermined value even though the electron beam 30 is generated normally, it is obvious that an accident has happened the connection cable J1. Thus, the power supply shut-down circuit 60 controls the voltage source 18 and terminates the voltage supply.

Figure 6:
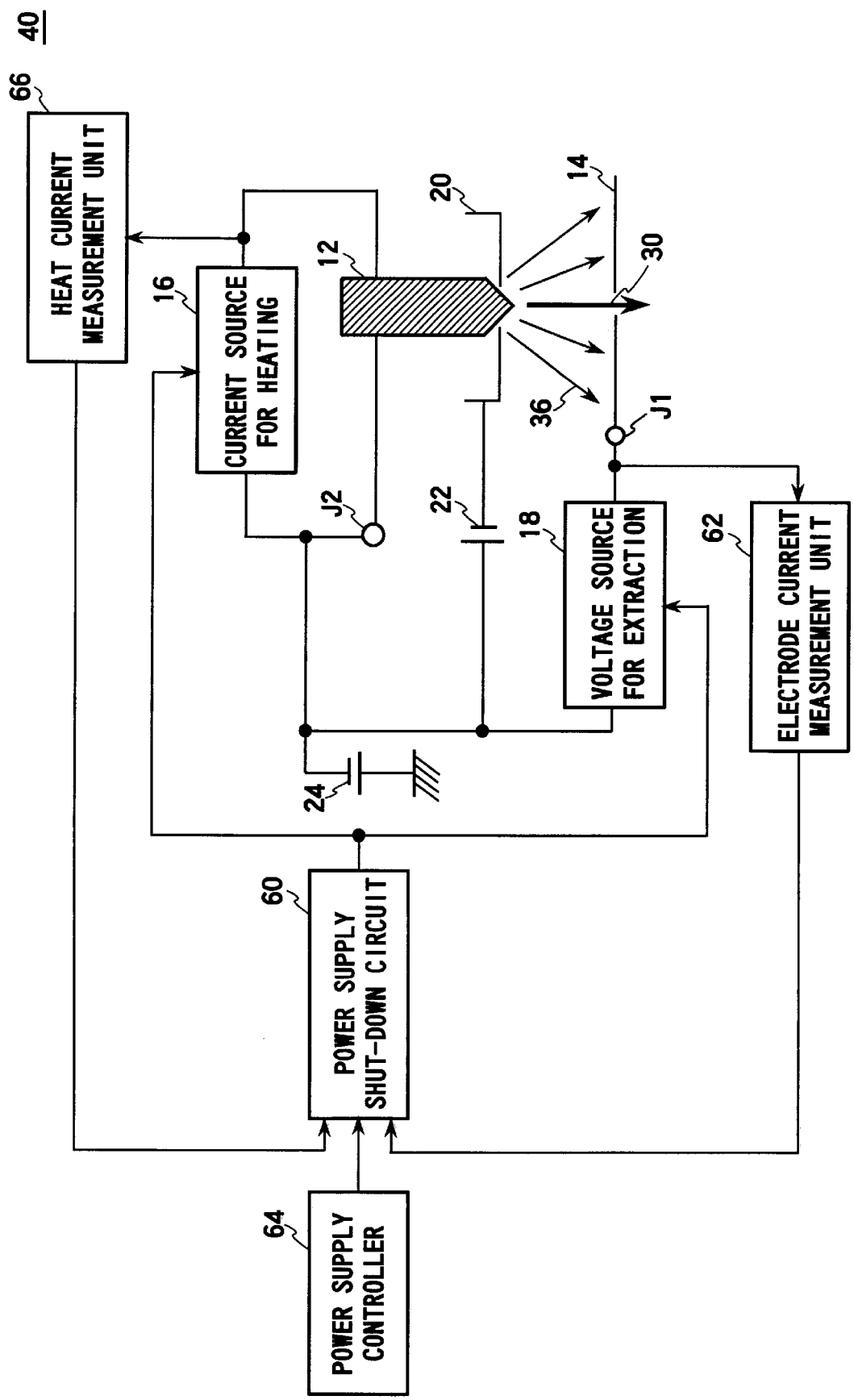
FIG. 6 shows a block diagram of the second embodiment of the charged particle generating apparatus 40 according to the present invention.

FIG. 6 shows a block diagram of the second embodiment of a charged particle generating apparatus according to the present invention. The charged particle generating apparatus 40 includes a first electrode 12, a second electrode 14, a current source 16 for heating the first electrode 12, a voltage source 18, a third electrode 20, a second voltage source 22 and a third voltage source 24. The charged particle generating apparatus 40 further includes a power supply shut-down circuit 60, an electrode current measurement unit 62, a power supply controller 64 and a heat current measurement unit 66. The second electrode 14 and the voltage source 18 are connected electrically via a connection cable J1. The first electrode 12 and the current source 16 are connected electrically via a connection cable J2. The charged particle generating apparatus 40 of this second embodiment is an electron gun generating an electron beam 30, and the first electrode 12 is a thermionic emission cathode.

Firstly, the current source 16 supplies a current to the first electrode 12 to heat the first electrode 12 to a predetermined temperature. For example, a current is gradually applied to the first electrode 12 of up to 2 to 3 amperes which heats the first electrode 12 up to 1800 to 2000 degrees centigrade. The voltage source 18 then applies voltage to the second electrode 14 such that an electric field is generated between the first electrode 12 and the second electrode 14. As is described in the conventional embodiment, the current and the voltage are applied by the current source 16 and the voltage source 18 respectively, in accordance with the respective current/time characteristics and the voltage/time characteristics shown in FIGS. 2 (*a*) and 2 (*b*). When a thermionic emission cathode is used as the first electrode 12, the electric field between the first electrode 12 and the second electrode 14 may be for example approximately $4 \times 10^3$ to $7 \times 10^3$ v/mm.

As a result of the electric field generated by the second electrode 14, the electron beam 30 is discharged from the first electrode 12. When the charged particle generating apparatus 40 is an electron gun, a negative voltage is applied to the third electrode 20 from the second voltage source 22. This results in the third electrode attracting the electron beam 30 to the second electrode 14. When the charged particle generating apparatus 40 is an electron gun, the third voltage source 24 applies negative potential to the whole charged particle generating apparatus 40 so that the electron beam 30 is easily irradiated from the charged particle generating apparatus 40. When, on the other hand, the charged particle generating apparatus 40 is an ion gun, the voltage source 18 applies negative voltage to the second electrode, the second voltage source 22 applies positive voltage to the third electrode 20, and the third voltage source 24 applies positive potential to the whole charged particle generating apparatus 40. This aids the charged particles to be easily irradiated from the charged particle generating apparatus 40.

As described above, the current source 16 applies current to the first electrode 12 to heat the first electrode 12. The heat current measurement unit 66 measures the amount of current to be supplied to the first electrode and transfers the measured value to the power supply shut-down circuit 60. The power supply shut-down circuit 60 is capable of as a minimum terminating either the current supply from the current source 16 or the voltage supply from the voltage source 18, based on the value of the current measured by the heat current measurement unit 66.

Figure 1:
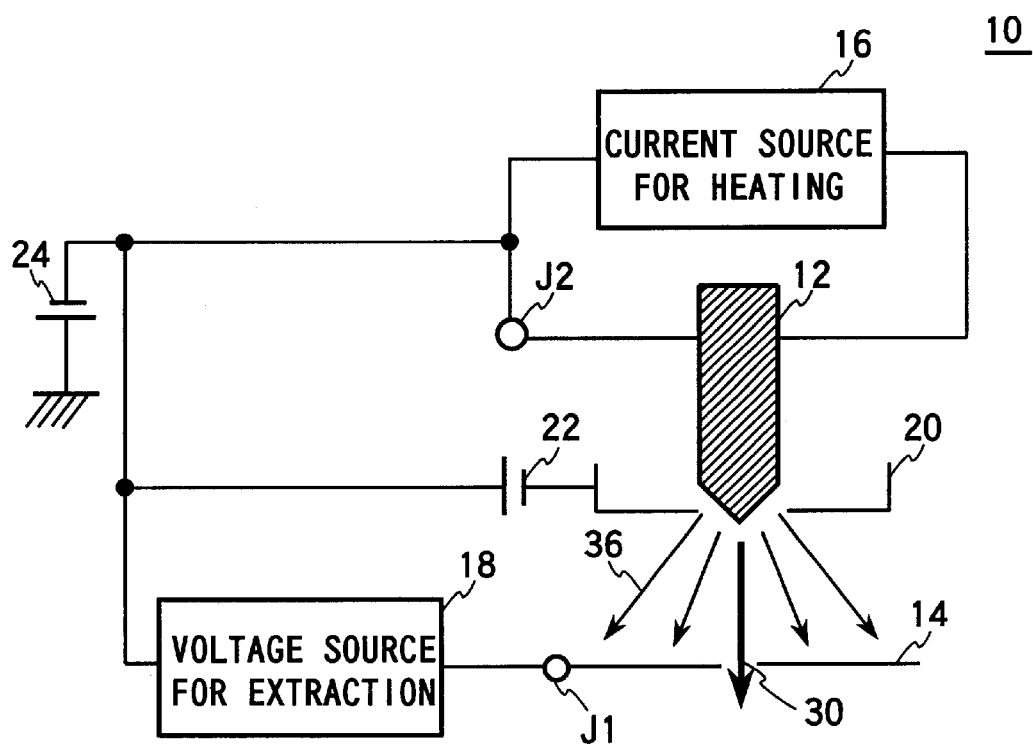
FIG. 1 shows a block diagram of the conventional charged particle generating apparatus 10.

How the power supply shut-down circuit 60 terminates either of the current supply from the current source 16 or the voltage supply from the voltage source 18 will be described in the following. In this method, the power supply controller 64 transfers a predetermined current value to the power supply shut-down circuit 60. The predetermined current value is a controlled value of current to be supplied from the current source 16 to the first electrode 12. The controlled value of the current corresponds to the value of the current shown in the current/time characteristic in FIG. 1(*a*). The power supply shut-down circuit 60 compares the value of the current measured by the heat current measurement unit 66 and the controlled value of the current output from the power supply controller 64. When the charged particle generating apparatus 40 generates the electron beam 30 normally, the measured value of the current is almost as same as the controlled value of the current.

However, when the connection cable J2 is damaged or has incomplete contact with the first electrode 12, the heat current measurement unit 66 cannot detect the current or detects only a part of the current.

Therefore, when the power supply shut-down circuit 60 detects that the measured value of the current is less than a predetermined value, even though the electron beam 30 is generated normally, it is obvious that the connection cable J2 is broken or incompletely connected. Thus, the power supply shut-down circuit 60 controls as a minimum either the current source 16 or the voltage source 18 to terminate the current supply or the voltage supply, respectively. The power supply shut-down circuit 60 may only terminate the current supply from the current source 16, or may only terminate the voltage supply from the voltage source 18. Alternatively, the power supply shut-down circuit 60 may terminate both the current supply from the current source 16 and the voltage supply from the voltage source 18.

Another means of the power supply shut-down circuit 60 to terminate either the current supply from the current source 16 or the voltage supply from the voltage source 18 based on the value of the current measured by the heat current measurement unit 66 will be described in the following. In this method, the power supply shut-down circuit 60 compares the value of the current measured by the heat current measurement unit 66 and a predetermined value. The predetermined value is set such that the-predetermined value is always less than the measured value when the charged particle generating apparatus 40 is generating the electron beam 30 normally. However, when the connection cable J2 is damaged or has incomplete contact with the first electrode 12, the heat current measurement unit 66 cannot detect the current or detects only a part of the current.

Therefore, when the power supply shut-down circuit 60 detects that the measured value of the current is less than a predetermined value although the electron beam 30 is generated normally, it is obvious that the connection cable J2 is either damaged or incompletely attached. Thus, the power supply shut-down circuit 60 controls at least either the current source 16 or the voltage source 18 to terminate the current supply or the voltage supply, respectively. The power supply shut-down circuit 60 may only terminate the current supply from the current source 16, or may only terminate the voltage supply from the voltage source 18. Alternatively, the power supply shut-down circuit 60 may terminate both the current supply from the current source 16 and the voltage supply from the voltage source 18.

As a result of the electric field generated by the second electrode 14, the electron beam 30, which is charged particles, is discharged from the first electrode 12. The electron beam 30 is irradiated onto a sample, which is shown as 46 in FIG. 4, through a slot 34 formed at the second electrode 14. However, some of the particles 36 do not pass through the slot 34 of the second electrode 14 and irradiate the second electrode 14 itself. Because of these particles irradiating the second electrode 14, an electrode current flows through the second electrode 14. The value of this electrode current is related to the amount of the charged particles discharged to the second electrode 14, and more specifically, is almost in a proportional relationship to the amount of the charged particles irradiated on the second electrode.

The value of the electrode current is measured by the electrode current measurement unit 62, and this value is transferred to the power supply shut-down circuit 60. The power supply shut-down circuit 60 is capable of terminating at least either the current supply from the current source 16 or the voltage supply from the voltage source 18.

How the power supply shut-down circuit 60 terminates at least either the current supply from the current source 16 or the voltage supply from the voltage source 18 based on the value of the electrode current measured by the electrode current measurement unit 62 will be described in the following. In this method, the power supply shut-down circuit 60 compares the measured value of the electrode current with a predetermined value of the electrode current. When the power supply shut-down circuit 60 detects that the measured value of the electrode current is greater than the predetermined value, the power supply shut-down circuit 60 continues voltage supply from the voltage source 18. When, on the other hand, the power supply shut-down circuit 60 detects that the measured value of the electrode current is less than the predetermined value, the power supply shut-down circuit 60 terminates the voltage supply from the voltage source 18. When the connection cable J1 is damaged or has incomplete contact with the second electrode 14, the electrode current measurement unit 62 cannot detect the current or detects only a part of the current.

Therefore, when the power supply shut-down circuit 60 detects that the measured value of the electrode current is less than the predetermined value even though the electron beam 30 is generated normally, it is obvious that the connection cable J1 is damaged or incompletely connected. Thus, the power supply shut-down circuit 60 controls at least either the current source 16 or the voltage source 18 to terminate the current supply or the voltage supply, respectively. The power supply shut-down circuit 60 may only terminate the current supply from the current source 16, or may only terminate the voltage supply from the voltage source 18. Alternatively, the power supply shut-down circuit 60 may terminate both the current supply from the current source 16 and the voltage supply from the voltage source 18.

Another means of the power supply shut-down circuit 60 terminating at least either the current supply from the current source 16 or the voltage supply from the voltage source 18 based on the value of the electrode current measured by the electrode current measurement unit 62 will be described in the following. In this method, the power supply controller 64 transfers a predetermined value of an electrode current to the power supply shut-down circuit 60. The predetermined value of the electrode current is a controlled value of an electrode current, flowing through the second electrode 14 because of the electric field generated by supplying voltage from the voltage source 18 to the second electrode 14. Then, the power supply shut-down circuit 60 compares the measured value of the electrode current and the controlled value of the electrode current transferred from the power supply controller 64. When the charged particle generating apparatus 40 is generating the electron beam 30 normally, the measured value of the electrode current is the same as the controlled value of the electrode current. However, when the connection cable J1 is damaged or has incomplete contact with the second electrode 14, the electrode current measurement unit 62 cannot detect the electrode current or detects only a part of the electrode current.

Therefore, when the power supply shut-down circuit 60 detects that the measured electrode current is less than the predetermined value although the electron beam 30 is generated normally, it is obvious that the connection cable J1 is damaged or incompletely attached. Thus, the power supply shut-down circuit 60 controls at least either the current source 16 or the voltage source 18 to terminate the current supply or voltage supply, respectively. The power supply shut-down circuit 60 may only terminate the current supply from the current source 16, or may only terminate the voltage supply from the voltage source 18. Alternatively, the power supply shut-down circuit 60 may terminate both the current supply from the current source 16 and the voltage supply from the voltage source 18.

Figure 7:
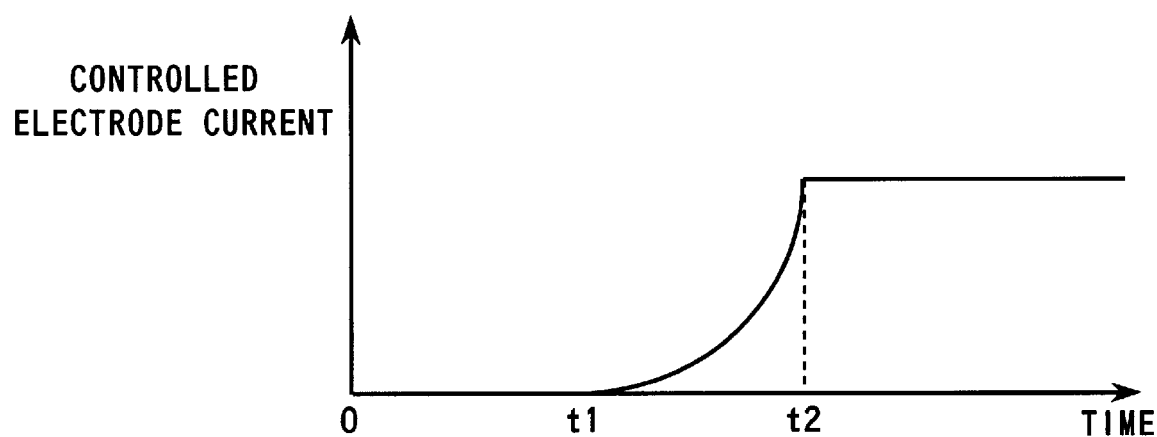
FIG. 7 shows the current/time characteristics of the controlled value of the electrode current of the second embodiment.

FIG. 7 shows the current/time characteristics of the controlled value of the electrode current of the second embodiment. In the second embodiment, when the first electrode 12 is a thermionic emission cathode, the entire amount of electrons discharged from the first electrode 12 has a proportional relationship to the voltage to be applied to the second electrode 14 to the power of three over two (3/2). The entire amount of electrons is almost equal to the sum of the amount of electrons irradiated from the charged particle generating apparatus 40 as the electron beam 30 and the amount of the electrons 36 irradiated onto the second electrode 14.

Figure 2:
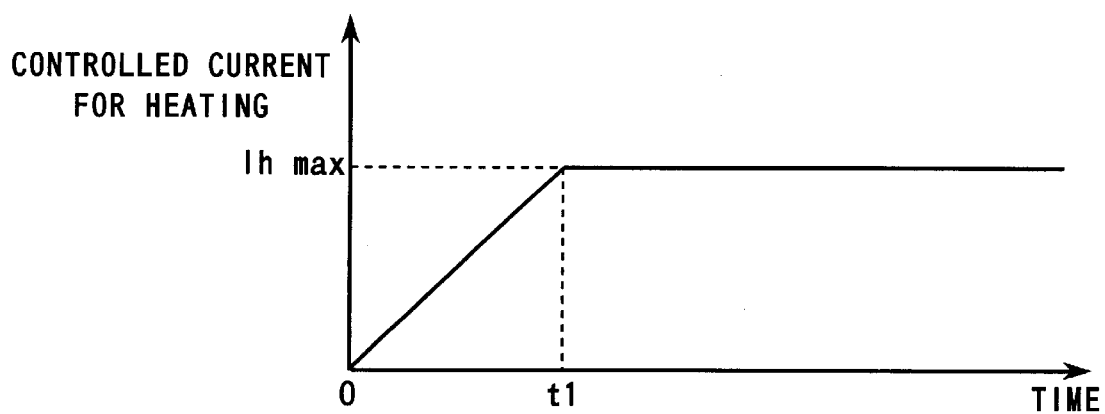
FIG. 2(a) shows a current/time chart showing the ideal controlled current to be applied to the first electrode 12 by the current source 16 in the conventional charged particle generating apparatus 10.
FIG. 2(b) shows a voltage/time chart showing the ideal controlled voltage to be applied to the second electrode 14 by the voltage source 18 in the conventional charged particle generating apparatus 10.
Figure 2:
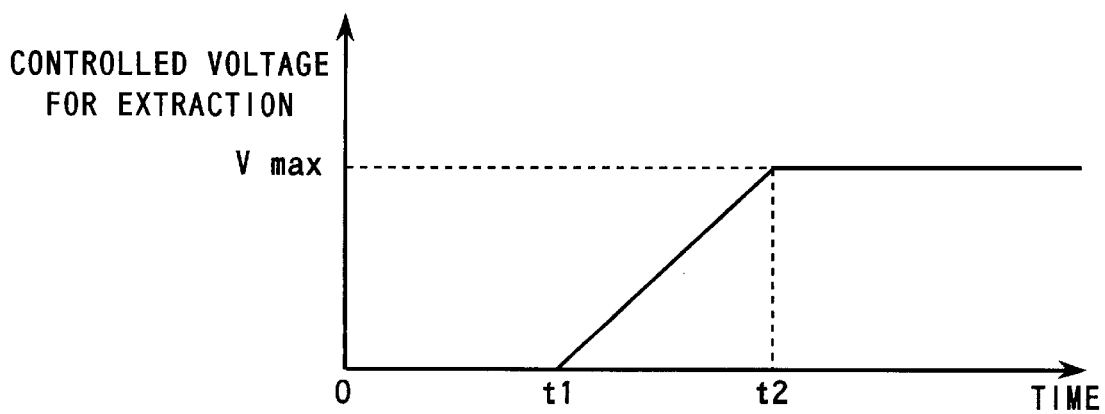

When assuming that the ratio of the amount of electrons irradiated on the second electrode 14 to the amount of electrons discharged from the charged particle generating apparatus 40 is constant regardless of the entire amount of electrons, the amount of electron should be the voltage generated between the first electrode and the second electrode to the power of three over two (3/2). Therefore, the controlled electrode current of the current/time characteristic shown in FIG. 7 equals the time to the power of three over two (3/2), between the time t1 and the time t2. This is based on the fact that the controlled voltage shown in FIG. 2 is simply increasing in proportion to the time, between the time t1 and the time t2. The current/time characteristic of the controlled electrode current is calculated based on the type of first electrode 12 to be used and the voltage/time characteristic of the voltage to be applied to the second electrode.

Figure 8:
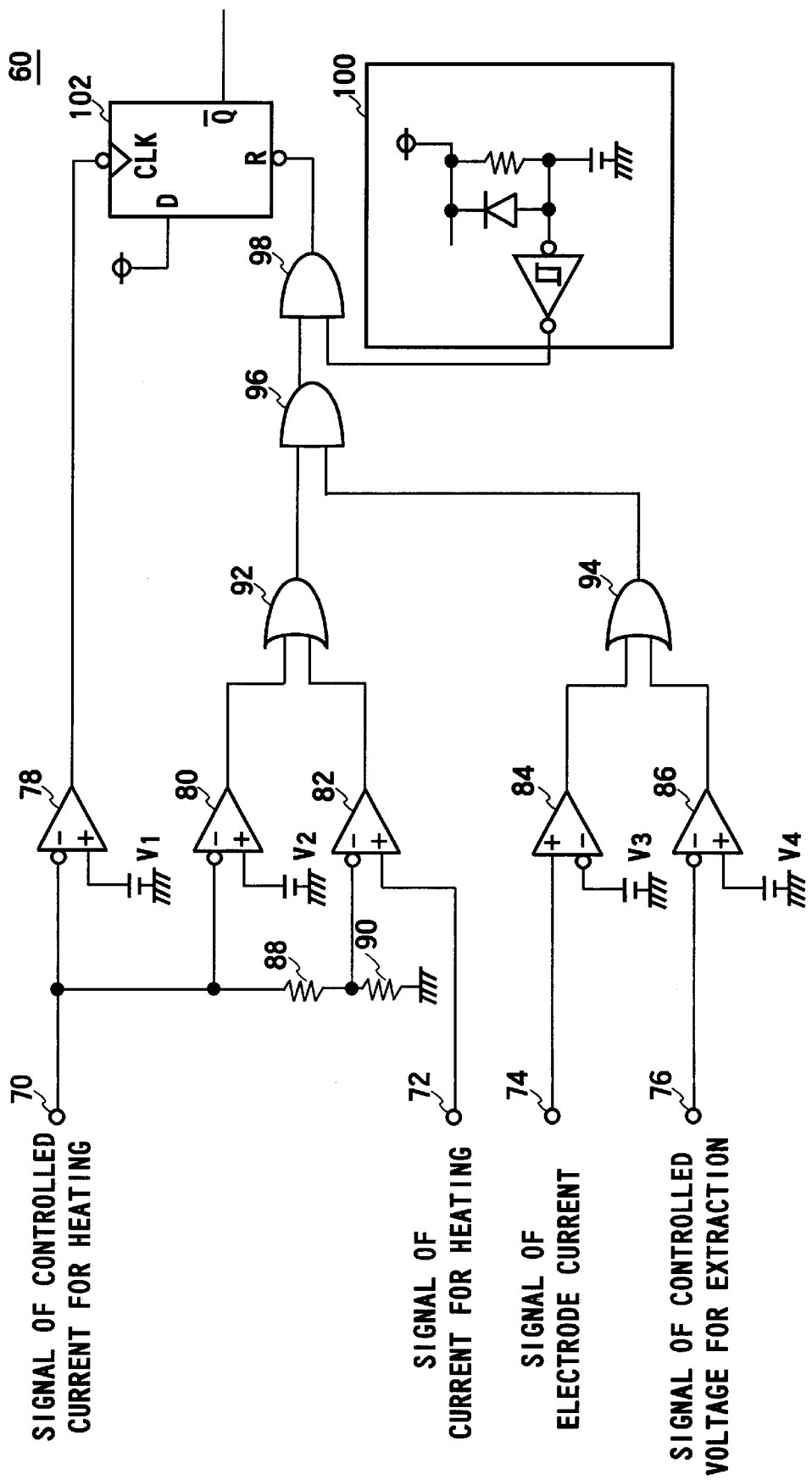
FIG. 8 shows a block diagram of the embodiment of the power supply shut-down circuit 60 shown in FIG. 6.

FIG. 8 shows the embodiment of the block diagram of the power supply shut-down circuit 60 shown in FIG. 6. The power supply shut-down circuit 60 includes signal input pins 70, 72, 74 and 76, comparators 78, 80, 82, 84 and 86, resistors 88 and 90, OR gates 92 and 94, AND gates 96 and 98, a power reset circuit 100, and a flip-flop 102. The power reset circuit 100 includes a resistor, a condenser and a diode. Each of the comparators 78, 80, 82, 84 and 86 has a plus input, a minus input and an output. Each of the OR gates 92 and 94 and AND gates 96 and 98 has inputs and an output. The power reset circuit 100 has an output.

The power supply shut-down circuit 60 in this embodiment terminates both the current supply from the current source 16 and the voltage supply from the voltage source 18 when either of the connection cables J1 or J2 is detected to be damaged.

The relationship between each component included in the power supply shut-down circuit 60 will be explained initially. An output of the comparator 78 is connected to a clock input CLK of the flip-flop 102. The flip-flop 102 is a negative-edge type flip-flop. The flip-flop 102 has a clock input CLK and a reset input R.

The outputs of the comparators 80 and 82 are connected to the input of the OR gate 92. The outputs of the comparators 84 and 86 are connected to the input of the OR gate 94. The outputs of the OR gates 92 and 94 are connected to the input of the AND gate 96. The outputs of the AND gate 96 and the power reset circuit 100 are connected to the input of the AND gate 98. An output of the AND gate 98 is connected to a reset input R of the flip-flop 102. The reset input R is activated by a signal "L".

A voltage V1 is applied to the plus input of the comparator 78, and the controlled current signal is input to the minus input of the comparator 78. The controlled current signal is a voltage signal corresponding to the current shown in FIG. 2(a). The signal is supplied from the power supply controller 64 via the signal input pin 70. A voltage V2 is applied to the plus input of the comparator 80, and the controlled current signal is input to the minus input of the comparator 80. A voltage split by the resistors 88 and 90 is applied to the minus input of the comparator 82, and a current signal is input to the plus input of the comparator 82. The current signal is a voltage signal corresponding to the current measured and supplied by the heat current measurement unit 66 via the signal input pin 72. The electrode current signal is input to the plus input of the comparator 84 and a voltage V3 is applied to the minus input of the comparator 84. The electrode current signal is a voltage signal corresponding to the electrode current measured and supplied by the electrode current measurement unit 62 via the signal input pin 74. The controlled voltage signal is input to the negative input of the comparator 86 and a voltage V4 is applied to the plus input of the comparator 86. The controlled voltage signal is a voltage signal corresponding to the controlled voltage shown in FIG. 2(b), and supplied from the power supply controller 64 via the signal input pin 76.

The conditions of the voltages V1 to V4 under which the power supply shut-down circuit 60 is operable will be described in the following.

Condition 1: V1<V2

As for the condition 1, the voltage V1 is set to be less than the voltage 2. The voltages V1 and V2 are set such that these values are significantly less than the voltage corresponding to the maximum current Ihmax.

Condition 2: when the controlled voltage signal>V4, the electrode current signal>V3

As for the condition 2, the voltages V3 and V4 are set such that when the controlled voltage signal is greater than the voltage V4, the electrode current signal is always greater than the voltage V3, under the condition when the charged particle generating apparatus 40 is operated normally.

The operation of the power supply shut-down circuit 60 will be described hereinafter based on the above conditions. Initially, the values of the controlled current signal, the current signal, the electrode current signal and the controlled voltage signal are all zero. At this time, the comparator 78 outputs "H", and similarly, the comparators 80 and 86 output "H". Thus, the OR gates 92 and 94 output "H" and the AND gate 96 also outputs "H" as a result.

From this initial condition, the power reset circuit 100 switches the power of the power supply shut-down circuit 60 on. When voltage is applied to the power reset circuit 100, the power reset circuit 100 outputs "L". As the output of the AND gate is "H" at this time, the AND gate 98 outputs "L" and the flip-flop 102 is reset to output "H". The output "H" from the flip-flop 102 is supplied to the current source 16 and the voltage source 18 to terminate the current supply and the voltage supply, respectively.

When charges are accumulated in a condenser of the power reset circuit 100, the power reset circuit 100 outputs "H". As the output of the AND gate 96 is "H" at this time, the AND gate 98 also outputs "H". Then, the power supply controller 64 outputs the controlled current signal as shown in FIG. 2(a). When the controlled current signal exceeds a predetermined level V1, the comparator 78 outputs "L". The negative edge of this type of flip-flop is triggered when the signal changes from "H" to "L".

Therefore, when the output from the comparator 78 is altered from "H" to "L", the flip-flop 102 outputs "L". The output of the flip-flop 102 "L" is supplied to the current source 16 and the voltage source 18 to restart the current supply and the voltage supply. Then, the current is supplied from the current source 16 and the voltage is supplied from the voltage source 18 as shown in FIGS. 2(a) and 2(b).

The operation of the comparators 80 and 82 will be described in the following. When the controlled current signal exceeds the voltage V2, the comparator 80 outputs "L". The comparator 82 compares the controlled current signal split by the resistors 88 and 90 (which will be referred to as the "split controlled current signal" hereinafter) with the current signal. The ratio of the resistors 88 and 90 are determined in such a way to have the current signal for heating larger than the split controlled current signal before the controlled current signal exceeds the voltage V2. When the current signal for heating is larger than the split controlled current signal, the comparator 82 outputs "H". When, on the other hand, the current signal for heating is less than the split controlled current signal, the comparator 82 outputs "L". At this time, as the output of the comparators 80 and 82 respectively become "L", the OR gate 92 outputs "L". Therefore, when "L" is input to the reset input R of the flip-flop 102, the flip-flop 102 outputs "H". The output of the flip-flop 102 "H" is supplied to the current source 16 and the voltage source 18 to terminate the current supply and the voltage supply, respectively.

The fact that the current signal for heating is less than the split controlled current signal shows that the connection cable J2 has malfunctioned in some way. According to the power supply shut-down circuit 60 of this embodiment, by comparing the current signal for heating with the split controlled current signal, the current supply from the current source 16 and the voltage supply from the voltage source 18 can be terminated immediately when the connection cable J2 malfunctions.

Although the current signal for heating and the split controlled current signal are compared in this embodiment, the controlled current signal not split by the resistors, may be compared with the current signal for heating to detect an abnormal condition in the connection cable J2. For example, by eliminating the resistor 88 shown in FIG. 8, the controlled current signal and the current signal for heating can be directly compared by the comparator 82.

The operation of the comparators 84 and 86 will be described in the following. When the voltage is applied to the second electrode 14, shown in FIG. 6, in a normal state, the electrode current signal is detected by the electrode current measurement unit 62. When the electrode current signal exceeds the voltage V3, the comparator 84 outputs "H". When, on the other hand, the controlled voltage signal exceeds the voltage V4, the comparator 86 outputs "L". From the condition 2 described above, the electrode current signal exceeds the voltage V3 when the controlled voltage signal exceeds V4, thus, the OR gate 94 always outputs "H" under the condition in which the generating apparatus 40 is operated normally.

Even when the comparator outputs "L", the value of the measured electrode current is zero if the connection cable J1 malfunctions. The comparator 84 outputs "L" at this time, and the output of the OR gate 94 becomes "L". Therefore, the outputs of the AND gates 96 and 98 become respectively "L" and "L" and are input to the reset input R of the flip-flop 102. The flip-flop then outputs "H" to the current source 16 and the voltage source 18. Thus, the current supply from the current source 16 and the voltage supply from the voltage source 18 are terminated.

If damage occurs to the connection cables J1 or J2, the comparators 82 or 84 output "L" and the current supply from the current source 16 and the voltage supply from the voltage source 18 are terminated. In order to restart the current supply from the current source 16 and the voltage supply from the voltage source 18, the controlled current signal is initially reduced to a value less than the voltage V1. The comparators 80 and 86 both output "H" at this time which is input to the reset input R of the flip-flop 102. The controlled current signal is then increased to a value greater than the controlled current signal in order to have the comparator 78 output "L". The signal "L" is input to the clock CLK of the flip-flop 102, and the flip-flop 102 outputs "L" to restart the current supply from the current source 16 and the voltage supply from the voltage source 18.

Figure 3A:
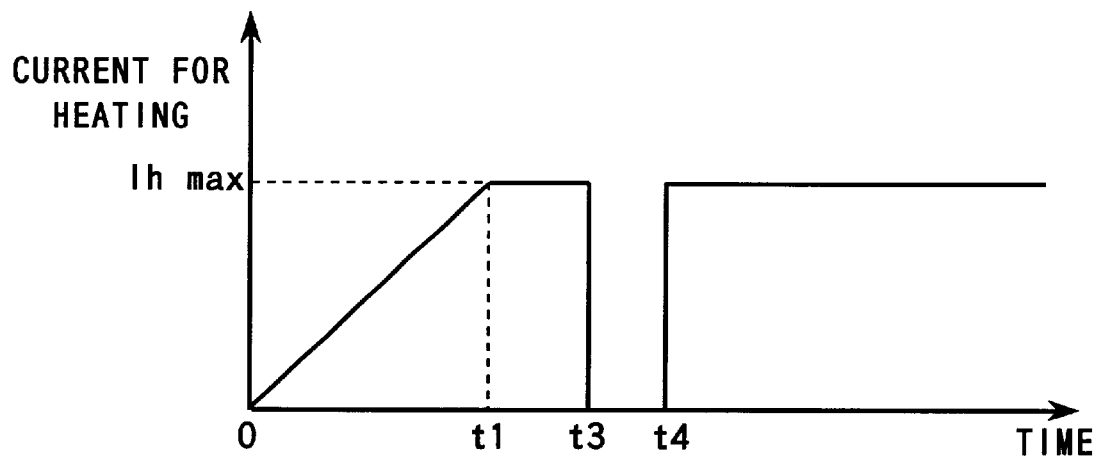
FIG. 3(a) shows a current/time chart showing current applied to the first electrode 12 by the current source 16 in the conventional charged particle generating apparatus 10.
Figure 9A:
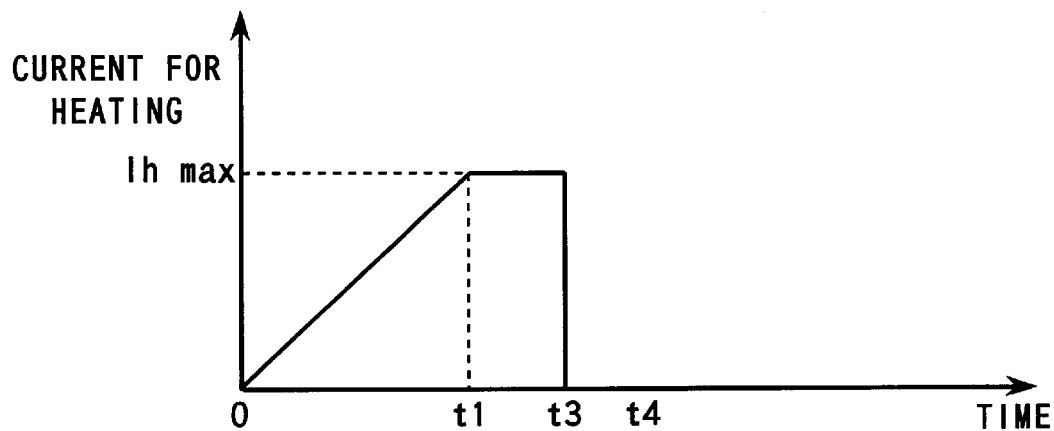
FIG. 9(a) shows current/time characteristics of the current flowing through the first electrode 12 when the connection cable J2 is accidentally disconnected at time t3.

FIG. 9(a) shows a current/time characteristic of current flowing through the first electrode 12 when the connection cable J2 malfunctions at time t3. Different from the current/time characteristic shown in FIG. 3(a), even when the connection cable J2 becomes normal at time t4, the current is not applied to the first electrode 12 in one step. Thus, the charged particle generating apparatus 40 of the present invention can prevent damage to the first electrode 12 caused by applying a large amount of current to the first electrode 12 instantaneously.

Figure 3B:
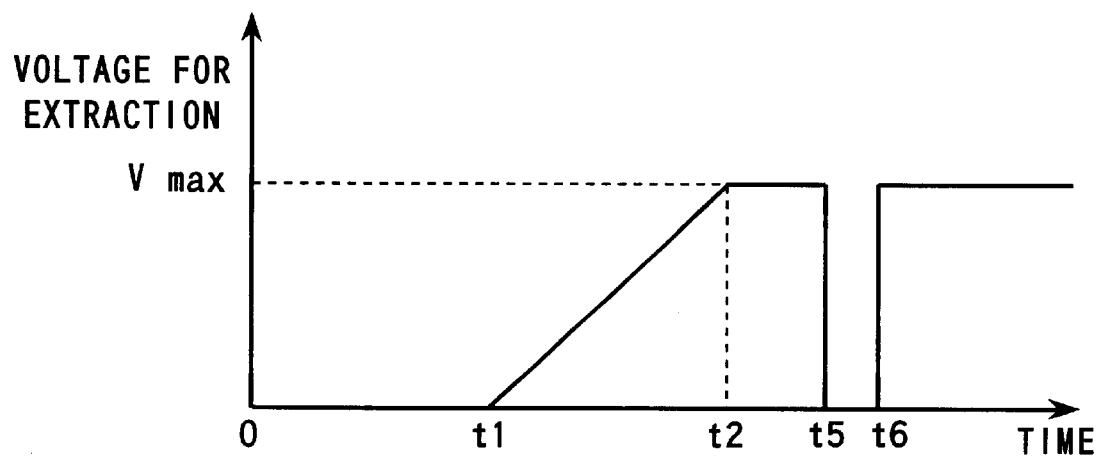
FIG. 3(b) shows a voltage/time chart showing voltage to be applied to the-second electrode 14 by the voltage source 18 in the conventional charged particle generating apparatus 10.
Figure 9B:
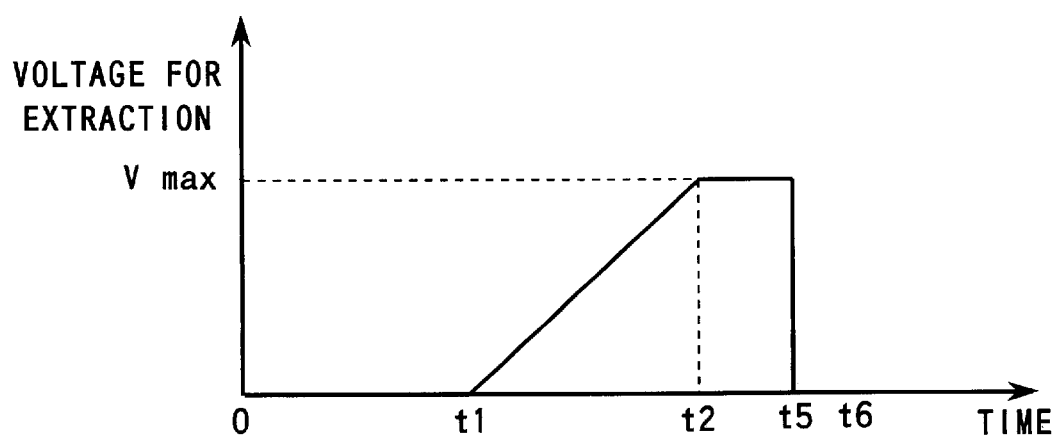
FIG. 9(b) shows voltage/time characteristics of the voltage applied to the second electrode 14 when the connection cable J1 is accidentally disconnected at time t5.

FIG. 9(b) shows voltage/time characteristics of the voltage applied to the second electrode 14 when the connection cable J1 malfunctions at time t5. Different from the voltage/time characteristic shown in FIG. 3(b), even when the connection cable J1 becomes normal at time t6, the voltage is not applied to the second electrode 14 in one step. Thus, the charged particle generating apparatus 40 of the present invention can prevent damage to the first electrode 12 caused by applying a large amount of voltage to the second electrode 14 instantaneously.

The charged particle generating apparatus 40 may be an ion gun although the charged particle generating apparatus 40 of above embodiments are described as an electron gun. The first electrode 12 may be a filamentary cathode or an anode for the ion gun, in addition to the cathode described in the above embodiments. The anode may include a multiport double electrode, and an ion source.

Furthermore, the technique of the present invention can be used to solve the problem which arises when wiring connecting the components of the charged particle generating apparatus 40 are cut or damaged. This is in addition to solving the problem arising due to malfunction of the connection cables J1 or J2.

As described above, the damage to the first electrode 12 can be prevented by the present invention.

According to the charged particle generating apparatus of the present invention, the damage to the electrode discharging charged particles caused by the incomplete contact of the connection cable to the apparatus is prevented.

Although the present invention has been described by way of exemplary embodiments, it should be understood that many changes and substitutions may be made by those skilled in the art without departing from the spirit and the scope of the present invention which is defined only by. the appended claims.

What is claimed is:

1. A charged particle generating apparatus comprising:
a first electrode operable to discharge charged particles;
a second electrode operable to generate an electric field to attract said charged particles from said first electrode;
a voltage source operable to generate an attraction voltage in said second electrode to generate said electric field between said first electrode and said second electrode;
an electrode current measurement unit operable to measure an electrode current flowing through said second electrode, said second electrode current being in accordance with an amount of said charged particles discharged from said first electrode to said second electrode;
and a power supply shut-down circuit operable to terminate said generation of said attraction voltage when said power supply shut-down circuit determines that a connection between said second electrode and said voltage source is one of a broken connection and an incomplete connection, based on said electrode current measured by said electrode current measurement unit.

2. A charged particle generating apparatus as set forth in claim 1, wherein said power supply shut-down circuit includes a comparator operable to compare said electrode current measured by said electrode current measurement unit with a predetermined value, said power supply shut-down circuit being operable to terminate said generation of said attraction voltage when said comparator detects that said measured electrode current is less than said predetermined value.

3. A charged particle generating apparatus comprising:
a first electrode operable to discharge charged particles;
a second electrode operable to generate an electric field to attract said charged particles from said first electrode;

a voltage source operable to generate an attraction voltage to generate said electric field between said first electrode and said second electrode;

an electrode current measurement unit operable to measure electrode current flowing through said second electrode in accordance with an amount of said charged particles discharged from said first electrode to said second electrode; and a power supply shut-down circuit operable to terminate said generation of said attraction voltage when said electrode current measured by said electrode current measurement unit is detected to be less than a predetermined value.

4. A charged particle generating apparatus as set forth in claim 3, wherein said power supply shut-down circuit is operable to terminate said generation of said attraction voltage when said electrode current measured by said electrode current measurement unit is detected to be about zero.

5. A charged particle generating apparatus comprising:

a first electrode operable to discharge charged particles;

a current source operable to supply a current to said first electrode for heating said first electrode;

a heat current measurement unit operable to measure said current for heating said first electrode;

a second electrode operable to generate an electric field to attract said charged particles from said first electrode;

a voltage source operable to generate an attraction voltage for generation of said electric field between said first electrode and said second electrode;

an electrode current measurement unit operable to generate electrode current flowing through said second electrode in accordance with an amount of said charged particles discharged from said first electrode to said second electrode;

and a power supply shut-down circuit operable to terminate at least one of said supply of said current for heating said first electrode and said generation of said attraction voltage based on at least one of a first determination that said current measured by said heat current measurement unit is less than a first predetermined value and a second determination that said electrode current measured by said electrode current measurement unit is less than a second predetermined value.

6. A charged particle generating apparatus as set forth in claim 5, wherein said power supply shut-down circuit terminates said generation of said attraction voltage based on said second determination.

7. A charged particle generating apparatus as set forth in claim 6, wherein said power supply shut-down circuit terminates said supply of said current for heating said first electrode based on said second determination.

8. A charged particle generating apparatus as set forth in claim 5, wherein said power supply shut-down circuit is operable to terminate said supply of said current for heating said first electrode based on said first determination.

9. A charged particle generating apparatus as set forth in claim 8, wherein said power supply shut-down circuit is operable to terminate said generation of said attraction voltage based on said first determination.

10. A charged particle generating apparatus as set forth in claim 5, wherein said first determination includes that current measured by said heat current measurement unit is about zero, and said second determination includes that said electrode current measured by said electrode current measurement unit is about zero.

11. An apparatus for irradiating charged particles on a sample to measure a condition of said sample by detecting reflection of secondary electrons radiated from said sample after said charged particles are irradiated on said sample, said apparatus, comprising:

a charged particle generating apparatus operable to irradiate said charged particles on said sample;

a focussing unit operable to focus said charged particles irradiated from said charged particle generating apparatus onto said sample;

a signal generator operable to receive said secondary electrons radiated from said sample and outputting a secondary electron detecting signal corresponding to an amount of said secondary electrons; and a measurement unit operable to measure said condition of said sample based on said secondary electron detecting signal;

wherein said charged particle generating apparatus comprises:

a first electrode operable to discharge charged particles;

a current source supplying a current to said first electrode for heating said first electrode;

a heat current measurement unit operable to measure said current for heating said first electrode;

a second electrode operable to generate an electric field to attract said charged particles from said first electrode;

a voltage source operable to generate an attraction voltage for generation of said electric field between said first electrode and said second electrode;

an electrode current measurement unit operable to measure electrode current flowing through said second electrode in accordance with an amount of said charged particles discharged from said first electrode to said second electrode; and a power supply shut-down circuit operable to terminate at least one of said supply of said current for heating said first electrode and said generation of said attraction voltage based on at least one of a first determination that said current measured by said heat current measurement unit is less than a first predetermined value and a second determination that said electrode current measured by said electrode current measurement unit is less than a second predetermined value.

12. A charged particle generating apparatus comprising:

a first electrode operable to discharge charged particles;

a current source operable to supply a current to said first electrode for heating said first electrode;

a heat current measurement unit operable to measure said current for heating said first electrode;

a second electrode operable to generate an electric field to attract said charged particles from said first electrode;

a voltage source operable to generate an attraction voltage to generate said electric field between said first electrode and said second electrode;

an electrode current measurement unit operable to measure electrode current flowing through said second electrode in accordance with an amount of said charged particles discharged from said first electrode to said second electrode; and a power supply shut-down circuit operable to terminate at least one of said supply of said current for heating said first electrode and said generation of said attraction voltage when said power supply shut-down circuit determines at least one of a first connection between said first electrode and said current source is one of a broken connection and an incomplete connection based on said current measured by said heat current measurement unit, and a second connection between said second electrode and said voltage source is one of a broken connection and an incomplete connection based on said electrode current measured by said electrode current measurement unit.

13. A charged particle generating apparatus as set forth in claim 12, wherein said power supply shut-down circuit includes a first comparator operable to compare said current measured by said heat current measurement unit with a first predetermined value, said power supply shut-down circuit determining said first connection is one of said broken connection and said incomplete connection when said first comparator detects that said measured current is less than said first predetermined value.

14. A charged particle generating apparatus as set forth in claim 13, wherein said power supply shut-down circuit includes a second comparator operable to compare said electrode current measured by said electrode current measurement unit with a second predetermined value, said power supply shut-down circuit determining said second connection is one of said broken connection and said incomplete connection when said second comparator detects that said measured electrode current is less than said second predetermined value.

15. A charged particle generating apparatus as set forth in claim 13, wherein said first comparator compares said current measured by said heat current measurement unit with a controlled value of a current to be supplied from said current source to said first electrode as said first predetermined value.

16. A charged particle generating apparatus as set forth in claim 12, wherein said power supply shut-down circuit determines that said first connection is said broken connection when said current measured by said heat current measurement unit is detected to be about zero.

17. A charged particle generating apparatus as set forth in claim 12, wherein said power supply shut-down circuit determines that said second connection is said broken connection when said electrode current measured by said electrode current measurement unit is detected to be about zero.

* * * * *